(12) United States Patent
Tokito (10) Patent No.: US 7,242,609 B2
(45) Date of Patent: Jul. 10, 2007

(54) METHODS AND APPARATUS FOR LOW POWER SRAM

(75) Inventor: Shunsaku Tokito, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/218,009

(22) Filed: Sep. 1, 2005

(65) Prior Publication Data

US 2007/0047349 A1   Mar. 1, 2007

(51) Int. Cl.
   *G11C 11/00* (2006.01)
   *G11C 7/00* (2006.01)
(52) U.S. Cl. ...................... 365/154; 365/203
(58) Field of Classification Search ............... 365/154, 365/203
   See application file for complete search history.

(56) References Cited

U.S. PATENT DOCUMENTS

| | | | | |
|---|---|---|---|---|
| 5,815,432 A | * | 9/1998 | Naffziger et al. | 365/154 |
| 5,828,612 A | * | 10/1998 | Yu et al. | 365/203 |
| 6,157,577 A | * | 12/2000 | McPartland | 365/189.05 |
| 6,741,493 B1 | * | 5/2004 | Christensen et al. | 365/154 |

* cited by examiner

*Primary Examiner*—Son Dinh
(74) *Attorney, Agent, or Firm*—Kaplan Gilman Gibson & Dernier LLP; Matthew B. Dernier (57) ABSTRACT

Methods and apparatus provide for pre-charging a bit line and a complementary bit line of an SRAM memory cell of the SRAM memory to a voltage level below a power supply level, Vdd, of the SRAM memory prior to writing data to the memory cell.

12 Claims, 6 Drawing Sheets

METHODS AND APPARATUS FOR LOW POWER SRAM

BACKGROUND

The present invention relates to methods and apparatus for controlling static random access memory (SRAM).

SRAM memory cells store data in the form of complementary low voltage and high voltage at opposite sides of the cell. An SRAM, unlike dynamic random access memory (DRAM), maintains the data content of the memory calls as long as power is applied to the cell. DRAM memory cells, on the other hand, are periodically refreshed with the stored data content. An SRAM cell includes a "true" node associated with a bit line of the SRAM memory and a complementary node associated with a complementary bit line of the SRAM memory. When the true node is read as a high voltage, the value of the SRAM memory cell is digital one. If the true node is read as a low voltage, the value of the SRAM memory cell is a digital zero.

During write and read cycles, a conventional SRAM memory system will employ a pre-charge circuit to drive the bit line and the complementary bit line to a power supply voltage of the SRAM memory, Vdd, before data is written to the memory cell. During the time that the data is actually written to the SRAM memory cell, a write buffer drives the bit line and the complementary bit line. Depending on the data being written (logic high or low) the bit line and complementary bit line will experience a full voltage swing between the pre-charge level, Vdd, and a common potential level, usually ground, Vss.

Successive write cycles at a relatively high frequency clock will cause successive full voltage swing on the bit line and complementary bit line. This produces power dissipation in the SRAM memory system. The power dissipation problem becomes significantly worse as the frequency of the clock increases, which is an ongoing circumstance as higher and higher memory performance remains a design goal.

Accordingly, there is a need in the art for a new approach to controlling SRAM memory cells in order to counteract the increase in power dissipation resulting from higher and higher clock frequencies.

SUMMARY OF THE INVENTION

In accordance with one or more embodiments of the invention, an SRAM memory system includes: at least one memory cell having a true node operatively coupled to a bit line and a complementary node operatively coupled to a complementary bit line; and at least one write pre-charge circuit operable to charge the bit line and the complementary bit line to a voltage level below a power supply level, Vdd, of the SRAM memory prior to writing data to the at least one memory cell.

The at least one write pre-charge circuit preferably includes at least one NMOS field effect transistor coupled from Vdd to the bit line and at least one NMOS field effect transistor coupled from Vdd to the complementary bit line. The write pre-charge circuit is operable to charge the bit line to about Vdd-Vth and to charge the complementary bit line to about Vdd-Vth. Vth is approximately a threshold voltage of the NMOS field effect transistors.

The SRAM memory system may also include at least one read pre-charge circuit operable to charge the bit line and the complementary bit line to a voltage level at about the power supply level, Vdd, of the SRAM memory prior to reading data from the at least one memory cell. The at least one read pre-charge circuit preferably includes at least one PMOS field effect transistor coupled from Vdd to the bit line and at least one PMOS field effect transistor coupled from Vdd to the complementary bit line.

The SRAM memory system may further include at least one write buffer having at least one NMOS field effect transistor coupled from Vdd to the bit line and at least one NMOS field effect transistor coupled from Vdd to the complementary bit line. The write buffer may also include at least one NMOS field effect transistor coupled from the bit line to Vss and at least one NMOS field effect transistor coupled from the complementary bit line to Vss. The write buffer is preferably operable to drive the bit line to about Vdd-Vth and to drive the complementary bit line to about Vss, when the data to be written is a logic high value. In addition, the write buffer is preferably operable to drive the complementary bit line to about Vdd-Vth and to drive the bit line to about Vss, when the data to be written is a logic low value.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
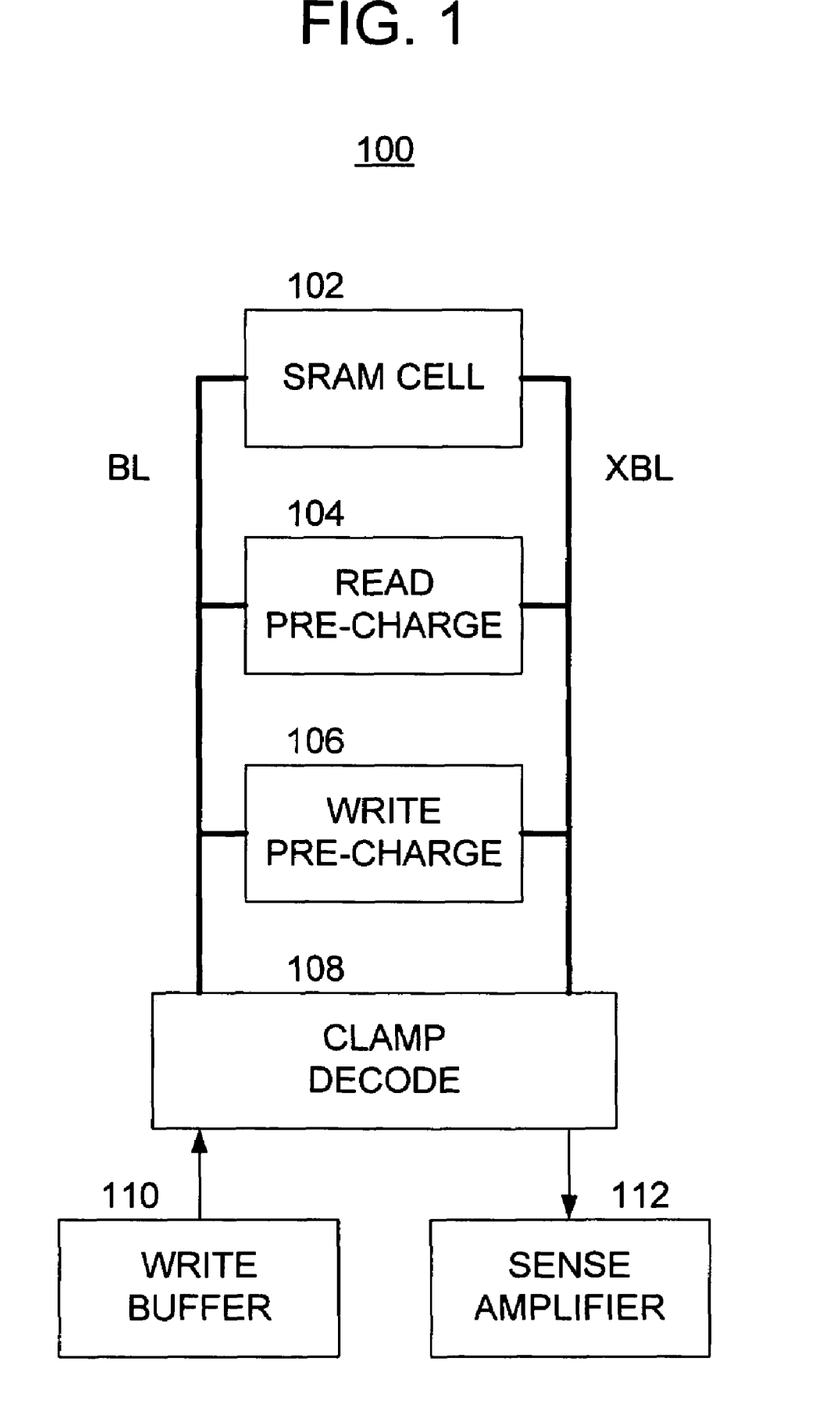
FIG. 1 is a block diagram illustrating an SRAM memory system in accordance with one or more embodiments of the present invention.

With reference to the drawings, wherein like numerals indicate like elements, there is shown in FIG. 1 an SRAM memory system 100 that may be adapted for carrying out one or more features of the present invention. For the purposes of brevity and clarity, the block diagram of FIG. 1 will be referred to and described herein as illustrating an apparatus 100, it being understood, however, that the description may readily be applied to various aspects of a method with equal force.

The SRAM memory system 100 includes an SRAM memory cell 102, a read pre-charge circuit 104, a write pre-charge circuit 106, a clamp decode circuit 108, a write buffer 110, and a sense amplifier 112. Although one SRAM memory cell 102 is shown for purposes of brevity and clarity, those skilled in the art will appreciate that a plurality of SRAM memory cells 102 will be employed in a memory system.

Figure 2:
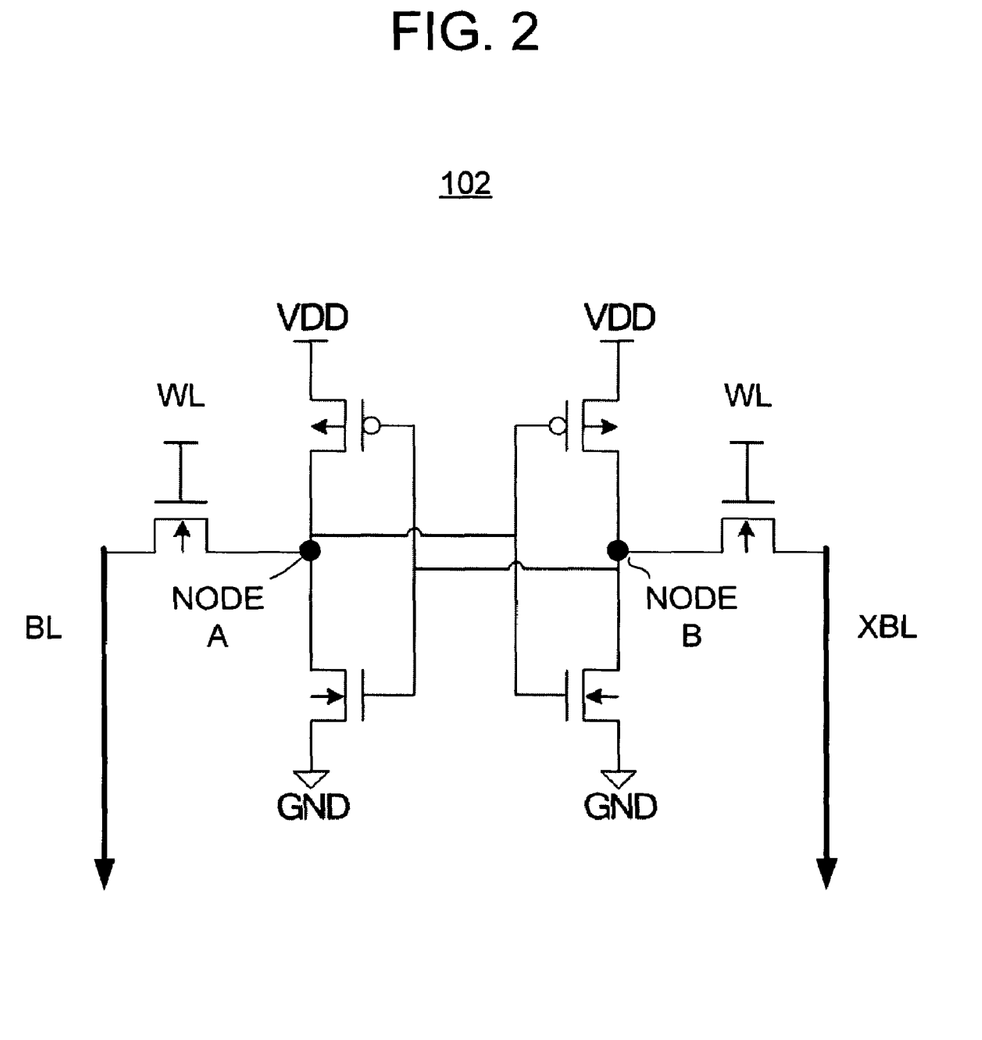
FIG. 2 is a detailed circuit schematic of an embodiment of an SRAM memory cell suitable for use with the system of FIG. 1.

With reference to FIG. 2, a detailed circuit schematic of an example of an SRAM memory cell 102 is illustrated that is suitable for use in the system 100. The SRAM memory cell 102 includes a plurality of (field effect transistors) FETs interconnected such that storage nodes A, B are associated with bit line BL and complementary bit line XBL, respectively. For the purposes of illustration, it is assumed that node A is a "true" node and node B is a "complementary" node, which are coupled to the bit line BL and the complementary bit line XBL by way of respective NMOS transistors. The NMOS transistors are controlled by a word line WL signal, which typically activates a plurality of SRAM memory cells used to store a single word of data. The SRAM memory cell 102 includes a PMOS transistor and an NMOS transistor connected in series across the power supply potential, Vdd to Vss (or ground). The true node A is located at the common connection between the PMOS and NMOS transistors. A second set of PMOS and NMOS transistors are interconnected to produce the complementary node B.

A bit of data is written to the SRAM memory cell 102 by turning on the respective NMOS transistors via the word line WL and presenting a potential voltage across the bit line BL and the complementary bit line XBL. For example, when the bit line BL is driven to the Vdd potential and the complementary bit line XBL is driven to Vss (e.g., ground), then the PMOS transistor associated with the true node A will turn on, the NMOS transistor associated with the true node A will turn off, the PMOS transistor associated with the complementary node B will turn off, and the NMOS transistor associated with the complementary node B will turn on. Thus, the true node A will be substantially at the Vdd voltage potential and the complementary node B will be substantially at the Vss (or ground) voltage potential. Those skilled in the art will appreciate that an opposite condition will be achieved when the voltage potentials driving the bit line BL and the complementary bit line XBL are reversed.

In accordance with this embodiment of the present invention, a high voltage potential (e.g., Vdd) on the true node A and a relatively low voltage potential (e.g., ground) on the complementary node B is interpreted as a logic high or digital one. Conversely, a relatively low voltage potential on the true node A and a relatively high voltage potential on the complementary node B is interpreted as a logic low or digital zero.

Data is written to the SRAM memory cell 102 by way of the write buffer 110 and data is read from the SRAM memory cell 102 by way of the sense amplifier 112. The clamp decode circuit 108 provides connection as between the write buffer 110, the sense amplifier 112, the bit line BL and the complementary bit line XBL. When data is to be written to the SRAM memory cell 102, the clamp decode circuit 108 provides a connection of the write buffer 110 to the bit line BL and the complementary bit line XBL. In this way, the relatively stiff voltage source of the write buffer 110 provides the appropriate voltage potentials on the bit line BL and the complementary bit line XBL in order to drive the true node A and the complementary node B to the appropriate levels in accordance with the data to be written. On the other hand, the clamp decode circuit 108 provides a connection between the sense amplifier 112 and the bit line BL and the complementary bit line XBL, when data is to be read from the SRAM memory cell 102. In this circumstance, the transistors of the SRAM memory cell 102 drive the bit line BL and the complementary bit line XBL such that the sense amplifier 112 can determine what voltage potentials are on the true node A and the complementary node B.

As will be discussed in more detail later in this description, the read pre-charge circuit 104 and the write pre-charge circuit 106 operate to drive the voltage on the bit line BL and the complementary bit line XBL to certain voltage potentials prior to a read operation or a write operation to the SRAM memory cell 102.

Figure 3:
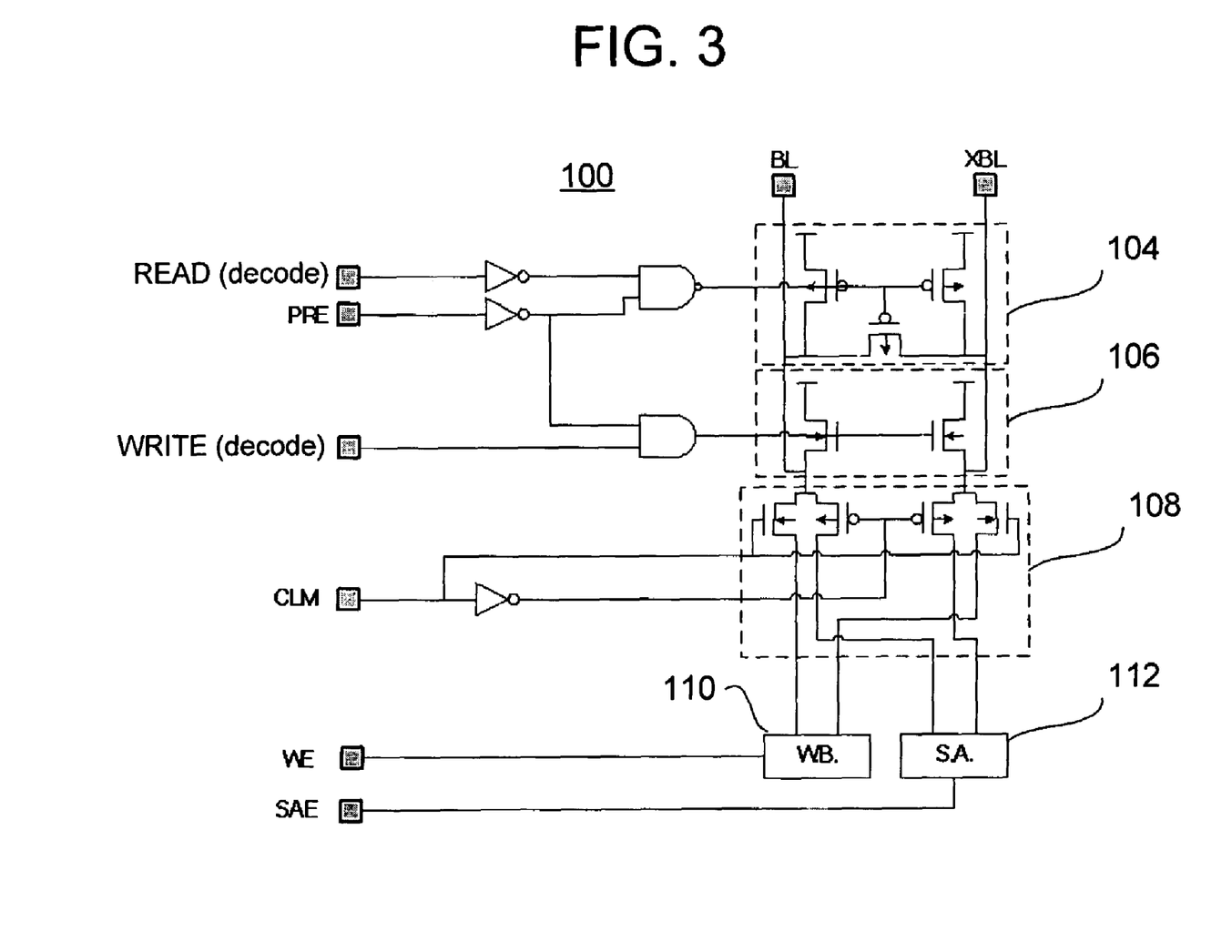
FIG. 3 is a more detailed circuit schematic of the SRAM memory system of FIG. 1.

Reference is now made to FIG. 3, which is a more detailed circuit diagram and block diagram of the memory system 100. It is noted that the circuit details of the SRAM memory cell 102 are omitted for purposes of brevity and clarity. The read pre-charge circuit 104 includes a plurality of PMOS transistors, at least one PMOS transistor being coupled from Vdd to each of the bit line BL and the complementary bit line XBL. In operation, the read pre-charge circuit 104 is operable to charge the bit line BL and the complementary bit line XBL to a voltage level at about the power supply level Vdd prior to reading data from the SRAM memory cell 102.

The write pre-charge circuit 106 preferably includes a plurality of NMOS transistors, a least one NMOS transistor being coupled from the power supply level Vdd to each of the bit line BL and the complementary bit line XBL. In operation, the write pre-charge circuit 106 is preferably operable to charge the bit line BL and the complementary bit line XBL to a voltage level below the power supply level Vdd prior to writing data to the SRAM memory cell 102. In particular, the write pre-charge circuit is preferably operable to charge the bit line BL to about Vdd-Vth, where Vth is the threshold voltage of the NMOS transistor that is coupled between Vdd and the bit line BL. Similarly, the write pre-charge circuit 106 is preferably operable to charge the complementary bit line XBL to about Vdd-Vth. As will be discussed in more detail herein, charging the bit line BL and complementary bit line XBL to a voltage level below the power supply level Vdd is advantageous in terms of reducing power dissipation in the memory system 100.

Figure 4:
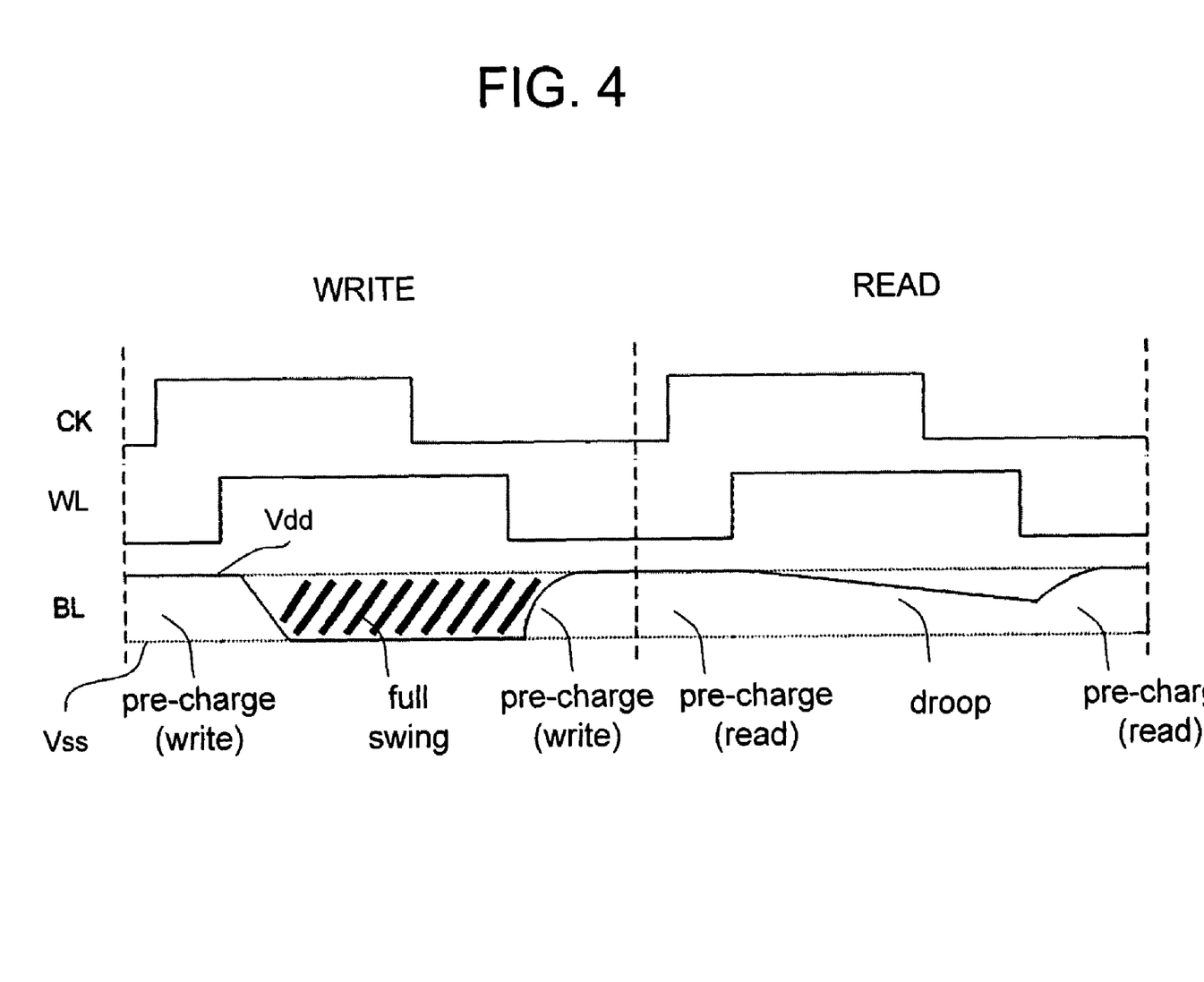
FIG. 4 illustrates timing diagrams of a write cycle and a read cycle for a conventional SRAM memory system.

In order to appreciate the advantages of the write pre-charge circuit 106, aspects of the conventional approach to pre-charging the bit line BL and the complementary bit line XBL will first be discussed. In this regard, reference is now made to FIG. 4, which is a timing diagram illustrating the states of various signals within a SRAM memory system during a write operation and a read operation. For purposes of discussion, it is understood that FIG. 4 illustrates the timing diagram for a memory system in which the same or similar pre-charge circuit is utilized for both the read and write operation. More specifically, the timing diagrams of FIG. 4 are those for a system in which the bit line BL and the complementary bit line XBL are charged to about Vdd prior to a write operation and prior to a read operation. Turning now to the details of FIG. 4, the CK signal is the clock signal to respective components of a the SRAM memory system. The WL (word line) signal indicates when the respective word line signals of the SRAM memory system are active. The bit line BL signal indicates the voltage level on the bit line during the read and write operations. As illustrated, prior to the write operation, the bit line BL is charged to the Vdd level. During the write operation, the write buffer may cause the bit line BL to swing fully between the Vdd level and ground (or Vss). Thereafter, the bit line BL may experience yet another pre-charge to the Vdd level. Assuming that the next operation into the SRAM memory cell is a read operation, the bit line BL will be pre-charged to the Vdd level. During the read operation, the active components of the SRAM memory cell itself will drive the bit line BL, which will cause the bit line BL to droop so long as the active components are driving the line. After the read operation, the bit line BL will again be pre-charged to Vdd level.

Notably, the fact that the bit line BL exhibits a full swing between Vdd and ground during the write operation results in relatively high power dissipation, particularly with respect to the write buffer. This problem is exacerbated when multiple write operations occur in succession and/or as the frequency of the clock CK increases.

Figure 5:
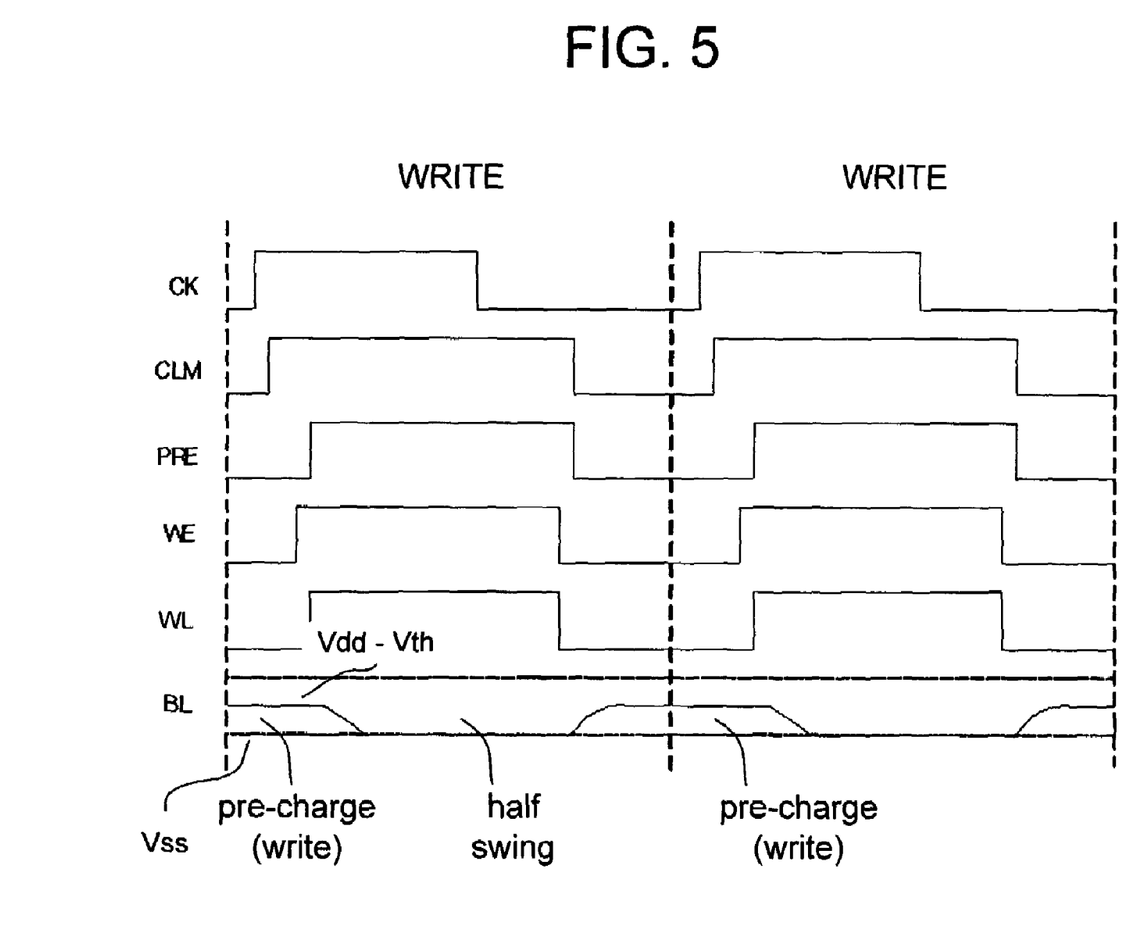
FIG. 5 illustrates timing diagrams of consecutive write cycles for the SRAM memory system of FIG. 1.

In accordance with one or more embodiments of the present invention, however, the write pre-charge circuit 106 operates such that the bit line BL and the complementary bit line XBL need not swing fully between the Vdd and the Vss (or ground) levels. In this regard, reference is made to FIG. 5, which is a timing diagram illustrating the states of respective signals and/or nodes in the memory system 100. Again, the CK signal is the clock signal to the memory system 100. The CLM signal indicates or controls when the clamp decode circuit 108 provides a connection between the write buffer 110 (or the sense amplifier 112) and the bit line BL and the complementary bit line XBL. The CLM signal is also shown in FIG. 3. The PRE signal indicates or controls the timing of the read pre-charge circuit 104 and the write pre-charge circuit 106. As best seen in FIGS. 3 and 5, the PRE signal in combination with a read signal (decode) operate to activate the read pre-charge circuit 104 prior to read operations. The illustrated combinational logic circuitry achieves the appropriate control signal states to the pre-charge circuit 104. Similarly, the PRE signal in combination with a write signal (decode) control the write pre-charge circuit 106 to activate prior to write operations. The WE signal is a write enable signal that activates the write buffer 110 during write operations. The WL signal is a word line signal that activates the respective coupling transistor between the true node A and the bit line BL, and between the complementary node B and the complementary bit line XBL (FIG. 2). Again, the bit line BL illustrates the voltage potential on that line during write operations.

When the PRE signal and the write signal (decode) activate the write pre-charge circuit 106, the bit line BL and complementary bit line XBL are charged to a voltage level at about Vdd-Vth. Depending on the magnitudes of Vdd and Vth, this level can be about one half of Vdd. Thus, during the write operation, the bit line BL (and the complementary bit line XBL) will not swing fully between Vdd and ground as in conventional systems. Rather, the bit line BL and the complementary bit line XBL will only swing by as much as Vdd-Vth, which may be half or less than that of the conventional memory system.

Advantageously, this substantially lower voltage swing on the bit line BL and the complementary bit line XBL results in significant reduction of power dissipation in the memory system 100, particularly when successive write operations are performed as illustrated in FIG. 5. Further, as best seen in FIG. 2, the lower steady state voltage on the bit line BL and the complementary bit line XBL during idle modes (e.g., other than write and read cycles) results in lower leakage current through the NMOS word line transistors when they are off. This also contributes to a reduction of power dissipation in the memory system 100. Still further, as best seen in FIG. 5 (as compared with FIG. 4) the lower voltage on the bit line BL and the complementary bit line XBL during write cycles results in a faster write period. Indeed, the time that the BL and the complementary bit line XBL swing from the high level (Vdd-Vth) to zero is shorter in FIG. 5 as compared with the time that the BL and the complementary bit line XBL swing from the high level (Vdd) to zero in FIG. 4.

Figure 6A:
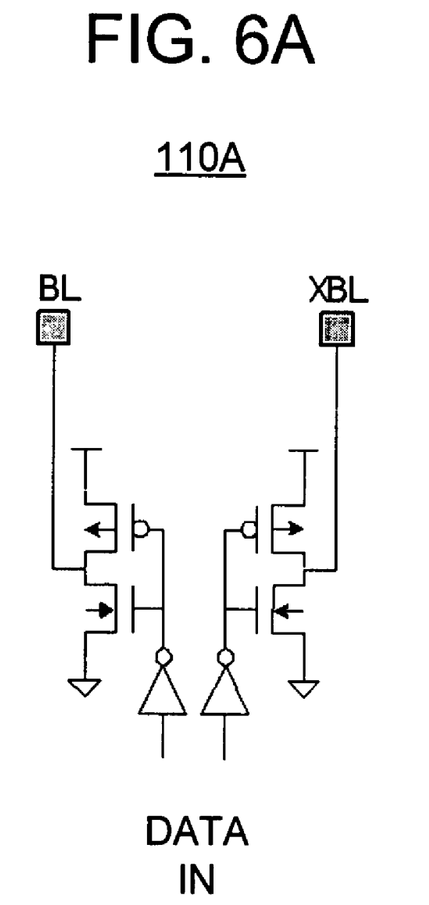
FIG. 6A is a detailed circuit schematic of a conventional write buffer.
Figure 6B:
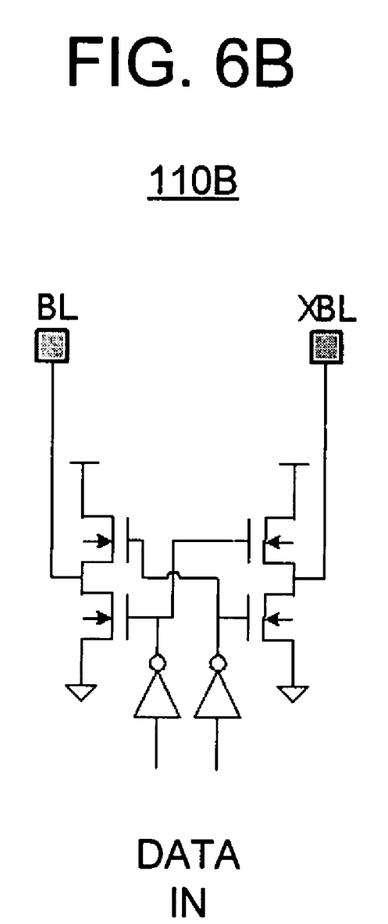
FIG. 6B is a detailed circuit schematic of an embodiment of a write buffer suitable for use with the system of FIG. 1.

With reference to FIGS. 6A-6B, the write buffer 110 preferably exhibits certain operational characteristics. In particular, the write buffer 110 is preferably not implemented utilizing a combination of NMOS and PMOS transistors as is illustrated in FIG. 6A. Rather, the write buffer 110 is preferably implemented utilizing NMOS transistors as illustrated in FIG. 6B. In the embodiment of FIG. 6B, the write buffer 110 is operable to drive the bit line BL to about Vdd-Vth and to drive the complementary bit line to about Vss, when the data to be written is a logic high value. Conversely, when the data to be written is a logic low value, the write buffer 110 is preferably operable to drive the complementary bit line XBL to about Vdd-Vth and to drive the bit line BL to about Vss. These operational characteristics advantageously match those of the write pre-charge circuit 106 in order to take more full advantage of the power savings capabilities of certain aspects of the present invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An SRAM memory system, comprising:
at least one memory cell having a true node operatively coupled to a bit line and a complementary node operatively coupled to a complementary bit line; and
at least one write pre-charge circuit operable to charge the bit line and the complementary bit line to a voltage level below a power supply level, Vdd, of the SRAM memory prior to writing data to the at least one memory cell, wherein the at least one write pre-charge circuit:
includes at least one NMOS field effect transistor coupled from Vdd to the bit line and at least one NMOS field effect transistor coupled from Vdd to the complementary bit line, and
is operable to charge the bit line to about Vdd-Vth and to charge the complementary bit line to about Vdd-Vth, where Vth is approximately a threshold voltage of the NMOS field effect transistors.

2. The SRAM memory system of claim 1, further comprising: at least one read pre-charge circuit operable to charge the bit line and the complementary bit line to a voltage level at about the power supply level, Vdd, of the SRAM memory prior to reading data from the at least one memory cell.

3. The SRAM memory system of claim 2, wherein the at least one read pre-charge circuit includes at least one PMOS field effect transistor coupled from Vdd to the bit line and at least one PMOS field effect transistor coupled from Vdd to the complementary bit line.

4. The SRAM memory system of claim 1, further comprising: at least one write buffer including at least one NMOS field effect transistor coupled from Vdd to the bit line and at least one NMOS field effect transistor coupled from Vdd to the complementary bit line.

5. The SRAM memory system of claim 4, wherein the at least one write buffer further includes at least one NMOS field effect transistor coupled from the bit line to Vss and at least one NMOS field effect transistor coupled from the complementary bit line to Vss.

6. The SRAM memory system of claim 4, wherein the write buffer is operable to drive the bit line to about Vdd-Vth and to drive the complementary bit line to about Vss, when the data to be written is a logic high value, where Vth is approximately a threshold voltage of the NMOS field effect transistors.

7. The SRAM memory system of claim 4, wherein the write buffer is operable to drive the complementary bit line to about Vdd-Vth and to drive the bit line to about Vss, when the data to be written is a logic low value, where Vth is approximately a threshold voltage of the NMOS field effect transistors.

8. An SRAM memory system, comprising:
   at least one memory cell having a true node operatively coupled to a bit line and a complementary node operatively coupled to a complementary bit line;
   at least one write pre-charge circuit operable to charge the bit line and the complementary bit line to a voltage level below a power supply level, Vdd, of the SRAM memory prior to writing data to the at least one memory cell; and
   at least one read pre-charge circuit operable to charge the bit line and the complementary bit line to about Vdd prior to reading data from the at least one memory cell,
   wherein the at least one write pre-charge circuit:
   includes at least one NMOS field effect transistor coupled from Vdd to the bit line and at least one NMOS field effect transistor coupled from Vdd to the complementary bit line, and
   is operable to charge the bit line to about Vdd-Vth and to charge the complementary bit line to about Vdd-Vth, where Vth is approximately a threshold voltage of the NMOS field effect transistors.

9. A method of controlling an SRAM memory, comprising pre-charging a bit line and a complementary bit line of an SRAM memory cell of the SRAM memory to a voltage level below a power supply level, Vdd, of the SRAM memory prior to writing data to the memory cell, wherein the voltage level below Vdd is about Vdd-Vth, where Vth is approximately a threshold voltage of an NMOS field effect transistor.

10. The method of claim 9, further comprising driving the bit line to about Vdd-Vth and driving the complementary bit line to about Vss, when the data to be written is a logic high value.

11. The method of claim 9, further comprising driving the complementary bit line to about Vdd-Vth and driving the bit line to about Vss, when the data to be written is a logic low value.

12. The method of claim 9, further comprising charging the bit line and the complementary bit line to a voltage level of about Vdd prior to reading data from the memory cell.

* * * * *